United States Patent
Singh et al.

(10) Patent No.: US 11,145,539 B2
(45) Date of Patent: Oct. 12, 2021

(54) SHALLOW TRENCH ISOLATION FOR INTEGRATED CIRCUITS

(71) Applicant: Taiwan Semiconductor Manufacturing Co., Ltd., Hsinchu (TW)

(72) Inventors: Gulbagh Singh, Uttar Pradesh (IN); Hsin-Chi Chen, Tainan (TW); Kun-Tsang Chuang, Miaoli (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/657,446

(22) Filed: Oct. 18, 2019

(65) Prior Publication Data

US 2020/0051851 A1     Feb. 13, 2020

Related U.S. Application Data

(63) Continuation of application No. 16/014,103, filed on Jun. 21, 2018, now Pat. No. 10,522,390.

(51) Int. Cl.
| | |
|---|---|
| *H01L 29/76* | (2006.01) |
| *H01L 21/762* | (2006.01) |
| *H01L 27/12* | (2006.01) |

(52) U.S. Cl.
CPC .. *H01L 21/76289* (2013.01); *H01L 21/76283* (2013.01); *H01L 27/1203* (2013.01)

(58) Field of Classification Search
USPC .......................................................... 257/213
See application file for complete search history.

(56) References Cited

U.S. PATENT DOCUMENTS

| | | |
|---|---|---|
| 7,015,116 B1 | 3/2006 | Lo et al. |
| 8,962,400 B2 | 2/2015 | Tsai et al. |

(Continued)

FOREIGN PATENT DOCUMENTS

| | | |
|---|---|---|
| JP | 2015084438 A | 4/2015 |
| KR | 20030024215 A | 3/2003 |
| KR | 100478270 A | 8/2004 |

OTHER PUBLICATIONS

Kohl, Low k, Porous Methyl Silsesquioxane and Spin-On-Glass, 1999, The Electrochemical Society, Inc, Electrochemical and Solid-State Letters, 2 (2) 77-79.*

(Continued)

*Primary Examiner* — Niki H Nguyen
(74) *Attorney, Agent, or Firm* — Sterne, Kessler, Goldstein & Fox P.L.L.C.

(57) ABSTRACT

The present disclosure describes a fabrication method that can form air-gaps in shallow trench isolation structures (STI) structures. For example, the method includes patterning a semiconductor layer over a substrate to form semiconductor islands and oxidizing the sidewall surfaces of the semiconductor islands to form first liners on the sidewall surfaces. Further, the method includes depositing a second liner over the first liners and the substrate and depositing a first dielectric layer between the semiconductor islands. The second liner between the first dielectric layer and the first liners is removed to form openings between the first dielectric layer and the first liners. A second dielectric layer is deposited over the first dielectric layer to enclose the openings and form air-gaps between the first dielectric layer and the first liners so that the gaps are positioned along the first liners.

20 Claims, 14 Drawing Sheets

(56) References Cited

U.S. PATENT DOCUMENTS

| | | |
|---|---|---|
| 9,093,514 B2 | 7/2015 | Tsai et al. |
| 9,236,267 B2 | 1/2016 | De et al. |
| 9,245,805 B2 | 1/2016 | Yeh et al. |
| 9,418,897 B1 | 8/2016 | Ching et al. |
| 9,520,482 B1 | 12/2016 | Chang et al. |
| 9,524,973 B1 | 12/2016 | Yoshida et al. |
| 9,576,814 B2 | 2/2017 | Wu et al. |
| 9,608,116 B2 | 3/2017 | Ching et al. |
| 9,812,363 B1 | 11/2017 | Liao et al. |
| 9,859,380 B2 | 1/2018 | Lee et al. |
| 2005/0167777 A1 | 8/2005 | Lee |
| 2006/0128114 A1* | 6/2006 | Youn ................ H01L 21/76224 438/424 |
| 2006/0131689 A1* | 6/2006 | Tsukidate .......... H01L 21/76232 257/506 |
| 2007/0194356 A1* | 8/2007 | Moon ................ H01L 27/1463 257/291 |
| 2007/0275537 A1 | 11/2007 | Henson et al. |
| 2007/0293017 A1 | 12/2007 | Yang |
| 2010/0311220 A1 | 12/2010 | Matsuo et al. |
| 2013/0320459 A1 | 12/2013 | Shue et al. |
| 2014/0374833 A1 | 12/2014 | Bian et al. |
| 2016/0240609 A1* | 8/2016 | Liu .................. H01L 29/66795 |
| 2016/0343608 A1* | 11/2016 | Umehara .......... H01L 21/02304 |
| 2018/0166322 A1 | 6/2018 | Lee et al. |
| 2019/0295844 A1* | 9/2019 | Lee ................ H01L 21/823821 |

OTHER PUBLICATIONS https://patentimages.storage.googleapis.com/WO2004057657A1/imgf000005_0001.png (Year: 2004).*

Tan, Philp Beow Yew, et al., "Measuring STI Stress Effect on CMOS Transistor by Stepping through the Channel Width," 2006 international RF and Microwave Conference Proceedings (Sep. 12-14, 2006), 3 pages.

Luo, Jie-Xin, et. al., "The Impact of Shallow-Trench-Isolation Mechanical Stress on the Hysteresis Effect of Partially Depleted Silicon-on-Insulator n-Type Metal-Oxide-Semiconductor Field Effects," Chin.Phys.Lett. vol. 31, No. 12 (2014) 126601, 4 pages.

Yang, Wenwei, et al., "Analysis of GIDL Dependence on STI-induced Mechanical Stress," Institute of Microelectronics, Tsinghua University, Beijing, China, (2005), 4 pages.

Office Action, dated Oct. 29, 2020, for Korean Intellectual Property Office Appl. No. 10-2019-0073355, 6 pages.

Notice of Allowance, dated Jul. 26, 2021, for Korean Intellectual Property Office Appl. No. 10-2019-0073355, 6 pages.

* cited by examiner

SHALLOW TRENCH ISOLATION FOR INTEGRATED CIRCUITS

CROSS-REFERENCE TO RELATED APPLICATION

This application is a continuation of U.S. Non-Provisional patent application Ser. No. 16/014,103, titled "Shallow Trench Isolation for Integrated Circuits," which was filed on Jun. 21, 2018 and is incorporated herein by reference in its entirety.

BACKGROUND

The rapid growth in smartphones, tablet personal computers (PCs), and other mobile consumer applications has increased the demand for chips based on radio frequency (RF) semiconductor-on-insulator (SOI) technology, particularly for antenna interface components and RF front-end-module (FEM) components like RF switches and antenna tuners.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

DETAILED DESCRIPTION

Figure 1:
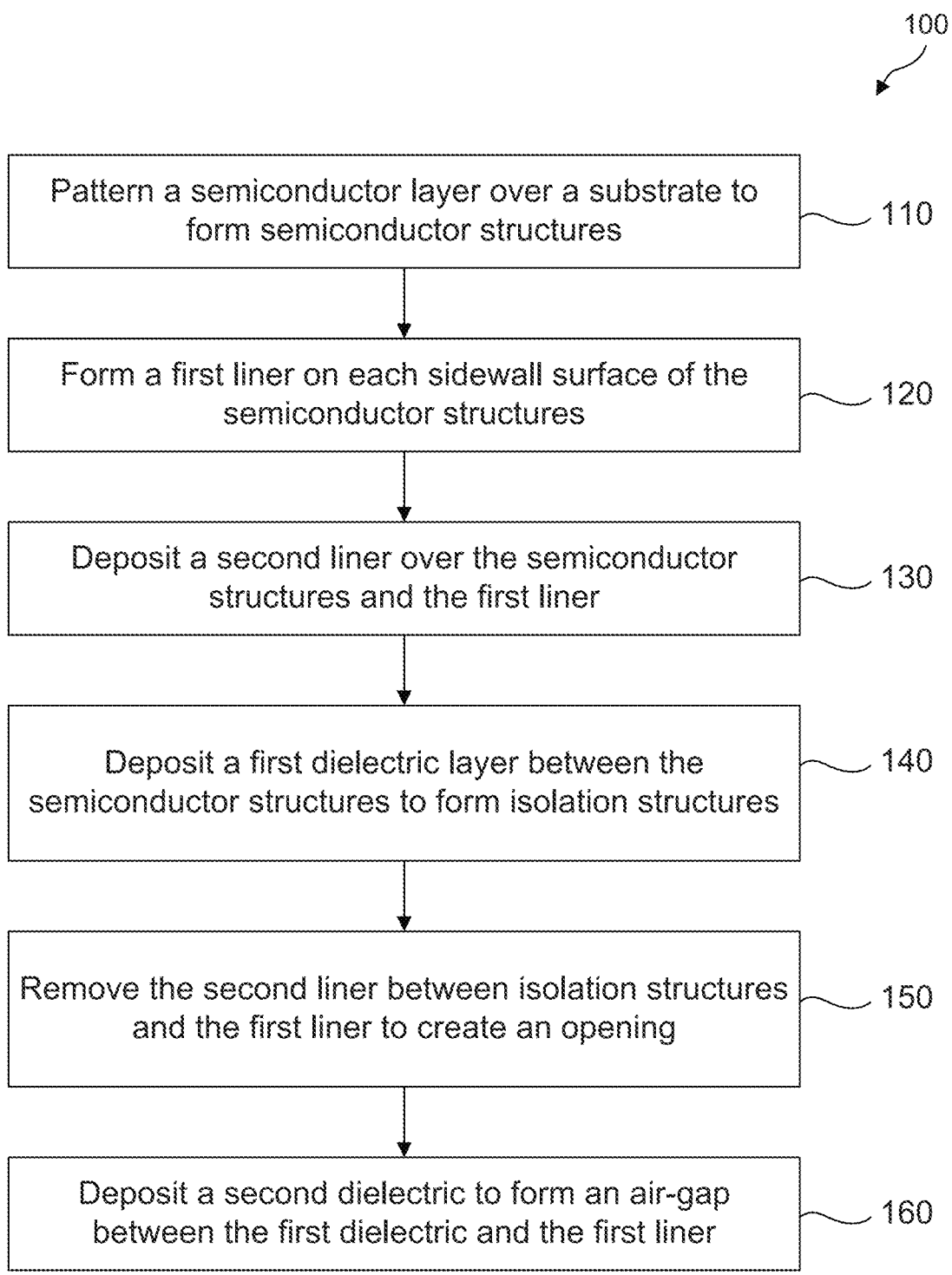
FIG. 1 is a flow diagram of a fabrication method that describes the formation of air-gaps along the sidewall surfaces of isolation structures, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

The term "substantially" as used herein indicates the value of a given quantity that can vary based on a particular technology node associated with the subject semiconductor device. Based on the particular technology node, the term "substantially" can indicate a value of a given quantity that varies within, for example, ±5% of a target (or intended) value.

The term "about" as used herein indicates the value of a given quantity that can vary based on a particular technology node associated with the subject semiconductor device. Based on the particular technology node, the term "about" can indicate a value of a given quantity that varies within, for example, 5-30% of the value (e.g., ±5%, ±10%, ±20%, or ±30% of the value).

The term "vertical," as used herein, means nominally perpendicular to the surface of a substrate.

The term "insulating layer", as used herein, refers to a layer that functions as an electrical insulator (e.g., a liner).

Embodiments of the present disclosure may be applicable to fin field effect transistors ("finFETs"). The "fins" in finFETs may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

A radio frequency (RF) front-end module (FEM) requires integration of multiple RF functions, including for example antenna low noise amplifiers (LNA), power amplifiers (PA), antenna tuning switches, transceivers, as well as digital processing and power management. Each RF FEM component can include a large number of field effect transistors (FETs) that are electrically isolated by shallow trench isolation (STI) structures. In addition to the electrical isolation, the STI structures can provide protection against parasitic coupling that can occur between adjacent FETs during normal device operation.

However, as the devices are continuously scaled down from one technology generation to the next, capacitive coupling between adjacent FETs can become more prominent. This is because the FETs are packed closer together and the space available for the STI structures, which are disposed between them, can be further reduced. Isolating highly packed FETs from parasitic capacitance coupling can be challenging for operating frequencies in the GHz range. Additionally, as the edge of the STI structures between the FETs comes closer to the channel region of each FET, unintentional compressive stress can be introduced to the channel region, which can be detrimental for the FET's performance (e.g., for the n-type FET's performance). For example, the unintentional compressive stress in the vicinity of the channel region can impact the electron mobility and, therefore, the current output of the NFETs.

The embodiments described herein are directed to a method that forms STI structures with air-gaps (air-pockets or cavities). The air-gaps, which can be formed along the sidewalls of the STI structures, can serve multiple purposes. In some embodiments, the STI structures with air-gaps can provide both enhanced electrical isolation between the FETs and protection against parasitic capacitance coupling when the device operates in the GHz range. This is because the air-gaps can lower the overall dielectric constant of the STI material (e.g., lower than 3.9). Further, due to the presence of air gaps, the STI structures can mitigate the compressive stress on the channel region of a neighboring FET, even if the edge of the STI structure is close to the channel region (e.g., within about 0.5 μm).

FIG. 1 is a flow chart of fabrication method 100, according to some embodiments. Fabrication method 100 describes the formation of air-gaps along the sidewall surfaces of STI structures. Fabrication method 100 can be used to form air-gaps either on selective STI structures or on all the STI structures of the substrate (e.g., the wafer). Other, or additional, fabrication operations may be performed between the various operations of fabrication method 100. These fabrication operations are omitted merely for clarity.

Figure 2:
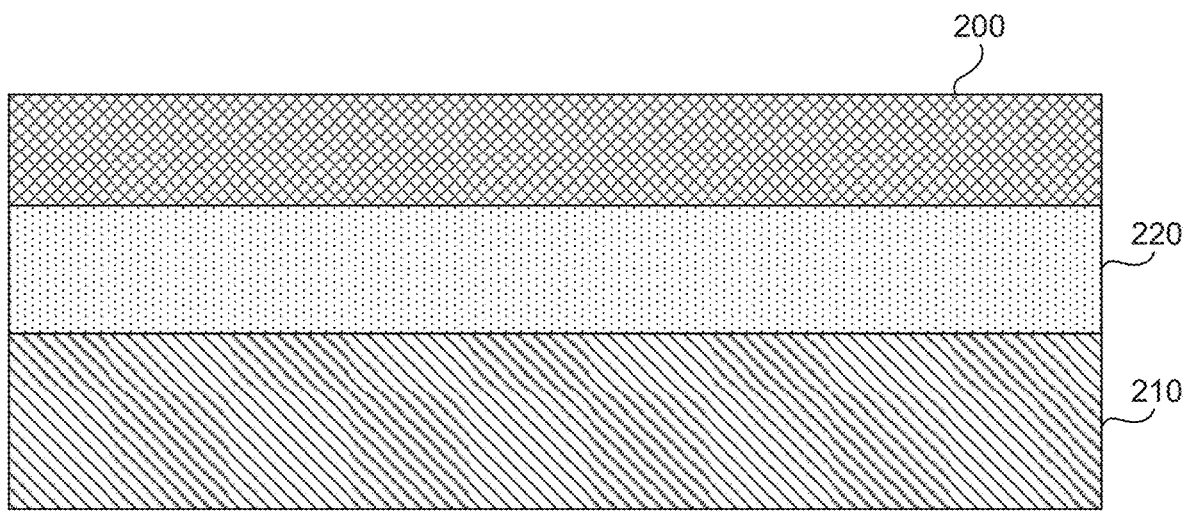
FIG. 2 is a cross-sectional view of a semiconductor layer over a substrate, in accordance with some embodiments.

Fabrication method 100 begins with operation 110, where a semiconductor layer is patterned over a substrate to form semiconductor structures. FIGS. 2-5 will be used to describe operation 110. For example, FIG. 2 is a cross-sectional view of semiconductor layer 200 over substrate 210. In some embodiments, substrate 210 can be a bulk silicon wafer with a dielectric layer 220 formed thereon and a top semiconductor layer 200. Dielectric layer 220 can be an oxide, such as silicon oxide (e.g., buried oxide layer), sapphire, or another suitable dielectric layer on which semiconductor layer 200 can be grown, attached, or otherwise formed. By way of example and not limitation, dielectric layer 220 is thicker than semiconductor layer 200. Further, dielectric layer 220 electrically isolates semiconductor layer 200 from substrate 210. In some embodiments, semiconductor layer 200 is directly on silicon substrate 210. In this case, substrate 210 can be a high-resistivity (HR) bulk silicon substrate. In other words, current cannot flow from semiconductor layer 200 to substrate 210.

According to some embodiments, semiconductor layer 200 can include (i) silicon, (ii) a compound semiconductor such as gallium arsenide (GaAs), gallium phosphide (GaP), indium phosphide (InP), indium arsenide (InAs), and/or indium antimonide (InSb), (iii) an alloy semiconductor including silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP), or (iv) combinations thereof.

For example purposes, semiconductor layer 200 in fabrication method 100 will be described in the context of a top silicon layer of a silicon-on-insulator substrate (e.g., SOI wafer). Based on the disclosure herein, other materials, as discussed above, can be used. These materials are within the spirit and scope of this disclosure.

Figure 3:
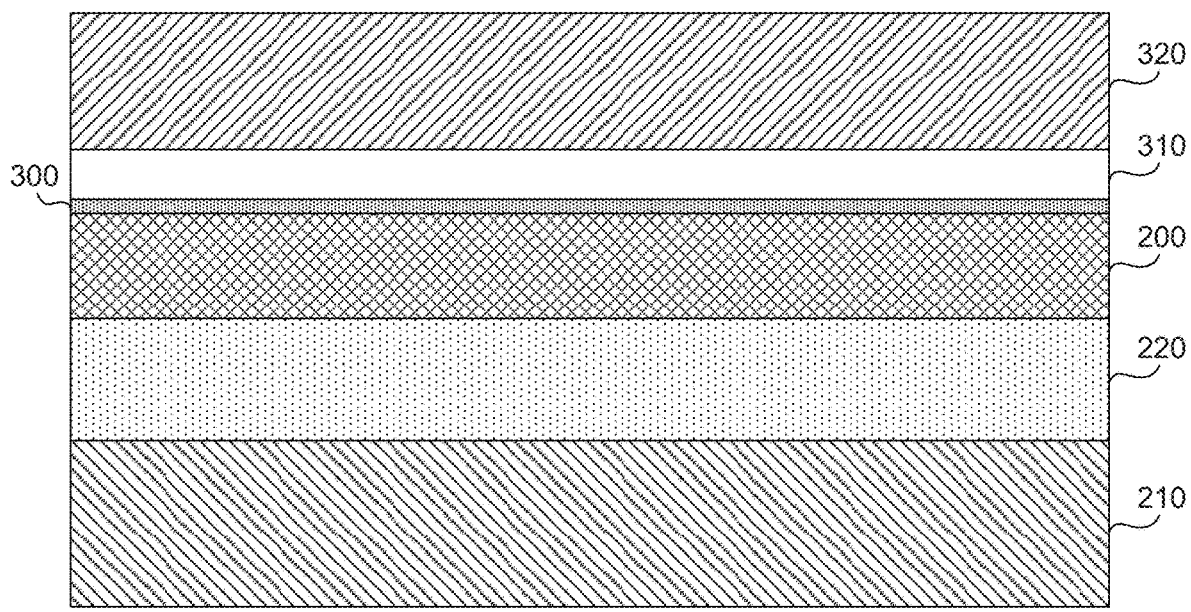
FIG. 3 is a cross-sectional view of a semiconductor layer over a substrate after the formation of a photoresist layer over the semiconductor layer, in accordance with some embodiments

Referring to FIG. 3, a stack including a bottom oxide layer 300 and a top nitride layer 310 are deposited over semiconductor layer 200. By way of example and not limitation, oxide layer 300 can include silicon oxide, and nitride layer 310 can include silicon nitride. Oxide layer 300 can be a capping layer that protects the top surface of semiconductor layer 200 during subsequent processing. By way of example and not limitation, nitride layer 310 can function as a stop layer in subsequent operations of fabrication method 100.

A photoresist layer 320 can be deposited over nitride layer 310. A bottom antireflective coating (BARC), which is not shown in FIG. 3, can be interposed between photoresist layer 320 and nitride layer 310. The BARC layer can suppress light reflections during a subsequent ultra violet (UV) or extreme ultra violet (EUV) light exposure of photoresist layer 320 and minimize undesirable generation of standing waves during the exposure process. Standing waves can increase the edge roughness of the resulting patterned photoresist structures. The BARC layer can also form a flat surface, on which photoresist layer 320 can be formed, by operating as a filler that fills small imperfections of the top surface of nitride layer 310.

Figure 4:
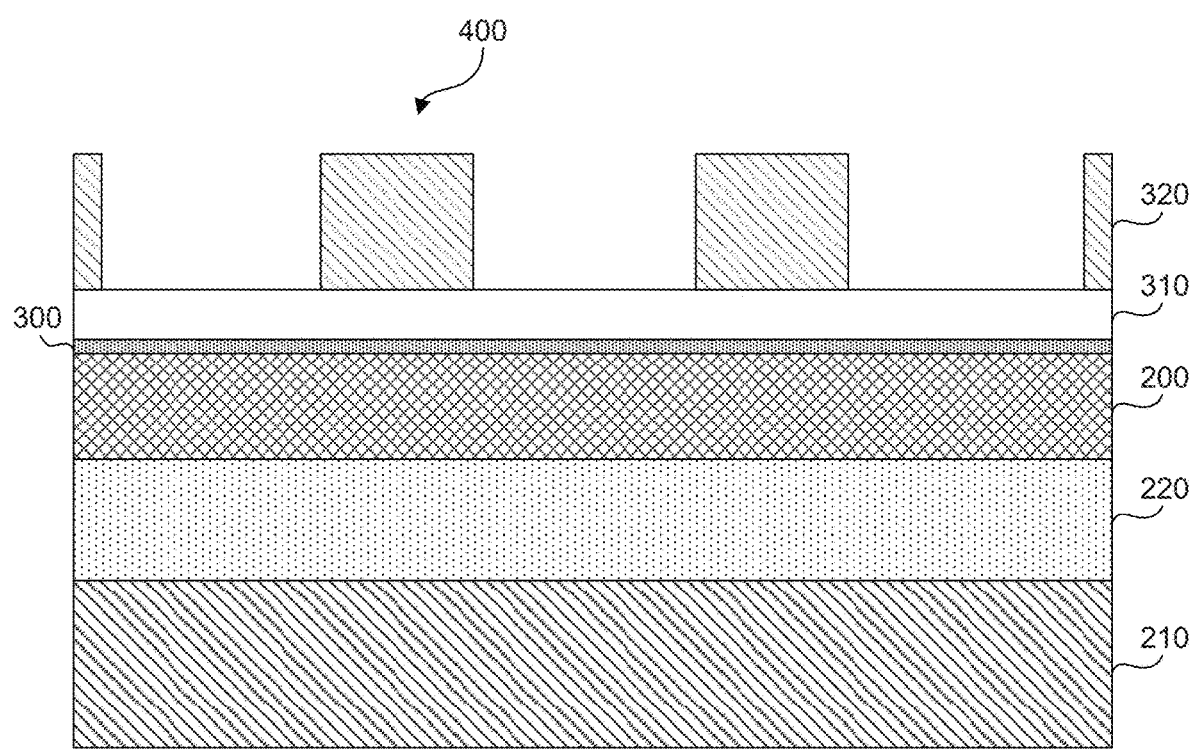
FIG. 4 is a cross-sectional view of a semiconductor layer over a substrate after the formation of patterned photoresist structures over the semiconductor layer, in accordance with some embodiments.

Photoresist layer 320 can be patterned so that patterned photoresist structures 400 are formed over nitride layer 310, as shown in FIG. 4. Patterning of photoresist layer 320 can be accomplished by exposing photoresist layer 320 to UV or EUV light through a reticle (photomask) and subsequently removing unexposed (or exposed portions) of the photoresist layer. The pitch (e.g., spacing) of patterned photoresist structures 400 may vary over substrate 210 depending on the pattern design. Therefore, high and low density areas of patterned photoresist structures 400 (e.g., patterned photoresist structures with different pitch or spacing) may be formed over different areas of substrate 210. Further, the width of the patterned photoresist structures 400 can also vary across substrate 210.

Figure 5:
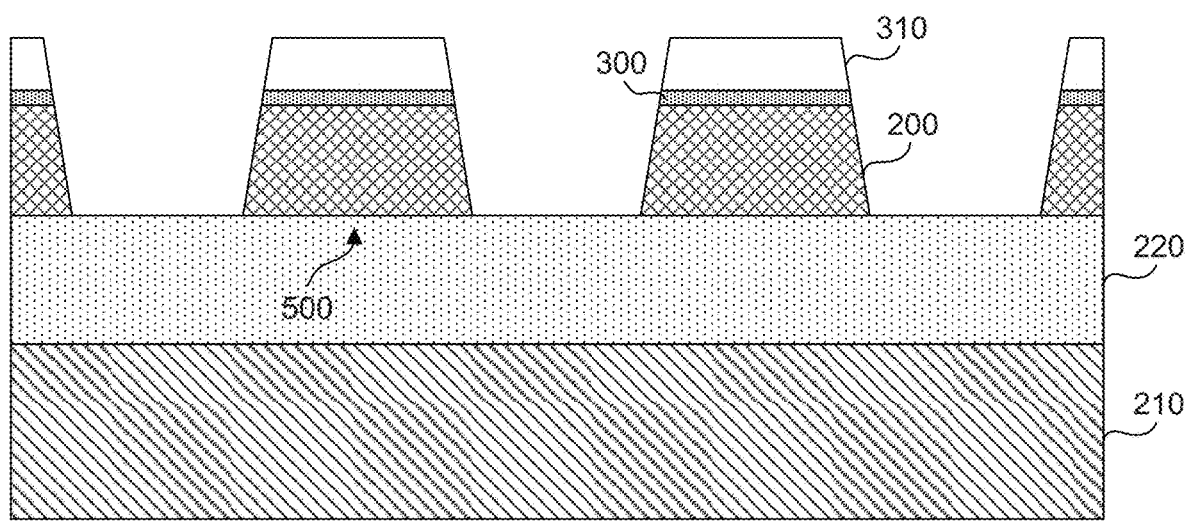
FIG. 5 is a cross-sectional view of semiconductor structures over a substrate, in accordance with some embodiments.

In referring to FIG. 5, a dry etch process can remove nitride layer 310, oxide layer 300 and semiconductor layer 200 between patterned photoresist structures 400 to form semiconductor structures, or semiconductor islands, 500. In other words, patterned photoresist structures 400 can be used as an etch mask to define the geometrical aspects of semiconductor structures 500. For example, the width and the pitch of the patterned photoresist structures 400 can be used to further define the width and the pitch of the resulting semiconductor structures 500. In some embodiments, the sidewalls of the resulting semiconductor structures 500 can have a positive slope, as shown in FIG. 5. However, this is not limiting, because semiconductor structures 500 can be designed to have substantially vertical sidewalls (e.g., between about 86° and about 90°), or sidewalls with a negative slope. The sidewall slope (or sidewall angle) of semiconductor structures 500 can be tuned by the dry etch process conditions. Therefore, the dry etch process conditions may be adjusted to achieve the desired slope for the sidewalls of semiconductor structures 500. In some embodiments, the dry etch process can include several etch sub-steps with a different etch chemistry for each sub-step.

After semiconductor structures 500 are formed, patterned photoresist structures 400 can be removed with a wet clean process (e.g., wet strip). In some embodiments, the height of the formed semiconductor structures 500 can be up to about 200 nm. However, this is not limiting and other heights for the semiconductor structures 500 may be considered.

Semiconductor structures 500 can be silicon structures where n-type or p-type FETs can be formed thereon. For example, semiconductor structures 500 can be doped to form source/drain regions, a channel region, etc. Further, local metal contacts can be formed on semiconductor structures 500 to electrically connect the terminals of the FETs (e.g., the source/drain and gate terminals) to other components of the chip.

Figure 6:
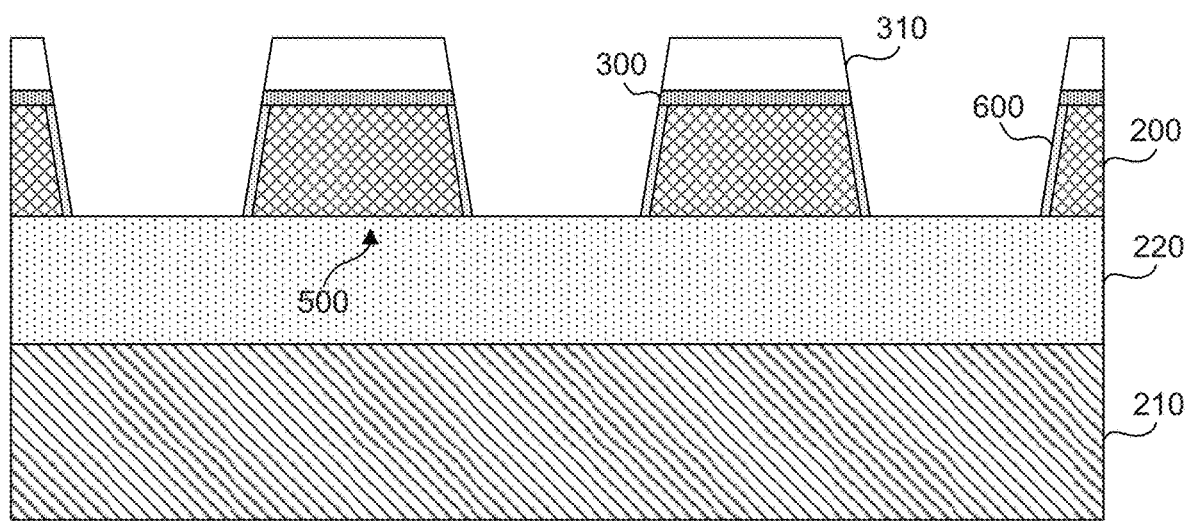
FIG. 6 is a cross-sectional view of semiconductor structures over a substrate after the formation of a first liner over the sidewalls of the semiconductor structures, in accordance with some embodiments.

In referring to FIG. 1, fabrication method 100 continues with operation 120 and the formation of a first liner on each sidewall surface of semiconductor structures 500. FIG. 6 is a cross-sectional view of semiconductor structures 500 after the formation of first liner 600 on each sidewall surface of semiconductor structure 500, according to the description of operation 120. By way of example and not limitation, first liners 600 can be formed by thermal oxidation of the exposed sidewalls surfaces of semiconductor structure 500. By way of example and not limitation, thermal oxidation of the sidewall surfaces of semiconductor structures 500 can occur in an oxidizing ambient that may include water vapors or molecular oxygen (e.g., wet or dry oxidation). During the thermal oxidation process, first liner 600 can be formed by consuming the silicon from the sidewall surfaces of semiconductor structures 500. In other words, a portion of first liner 600 is grown inwards from the sidewall surface. In some embodiments, first liner 600 includes silicon oxide (e.g., silicon dioxide ($SiO_2$)). By way of example and not limitation, the oxidation process can be performed at a temperature between about 800° C. and about 1200° C. (e.g., between 900° C. and 1100° C.). The thickness of the first liner can range from about 5 nm to about 20 nm. Since the only exposed silicon areas available for oxidation are the sidewall surfaces of semiconductor structures 500, first liners 600 will be selectively grown on (or be "self-aligned" to) the sidewall surfaces of semiconductor structures 500.

Figure 7:
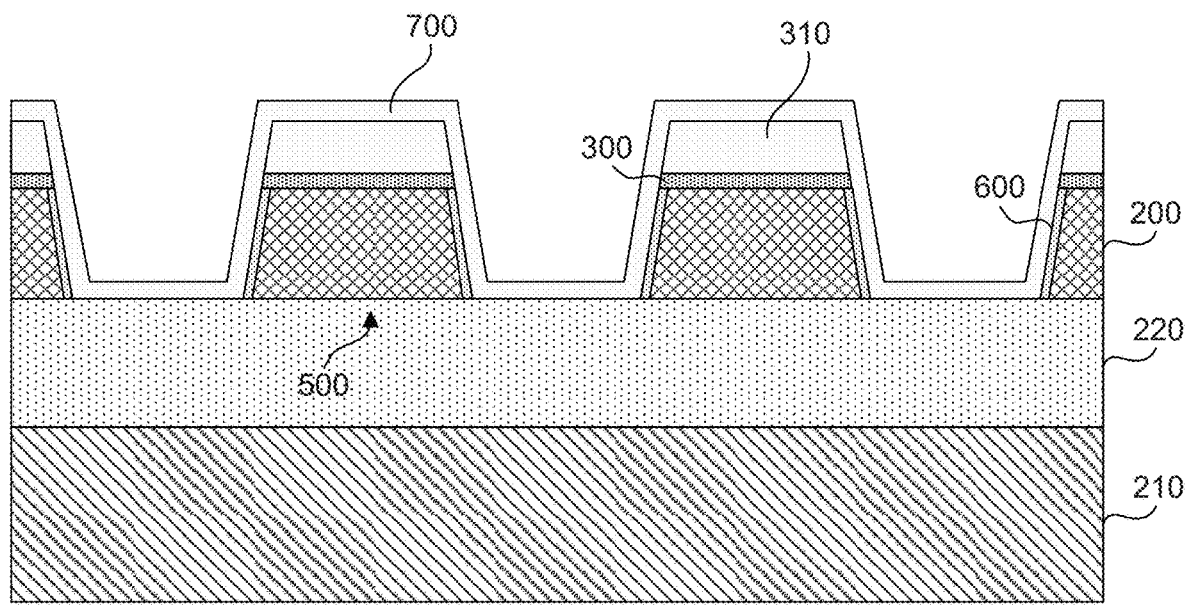
FIG. 7 is a cross-sectional view of semiconductor structures over a substrate after the formation of a second liner over the semiconductor structures, in accordance with some embodiments.

Fabrication method 100 continues with operation 130 and the deposition of a second liner 700 as shown in FIG. 7. Second liner 700 can be deposited over nitride layer 310, first liner 600 and dielectric layer 220. By way of example and not limitation, second liner 700 can be deposited by chemical vapor deposition (CVD), plasma-enhanced chemical vapor deposition (PECVD), atomic layer deposition (ALD), plasma-enhanced atomic layer deposition (PEALD), or any other suitable conformal deposition method. In some embodiments, second liner 700 has a thickness between about 10 nm and about 50 nm. By way of example and not limitation, second liner 700 and nitride layer 310 can be the same material. In other words, second liner 700 can include silicon nitride. In some embodiments, second liner 700 can be considered a "sacrificial" spacer or a sacrificial layer formed over the sidewalls of semiconductor structures 500. For example, second liner 700 can be removed in a subsequent operation of fabrication method 100.

Figure 8:
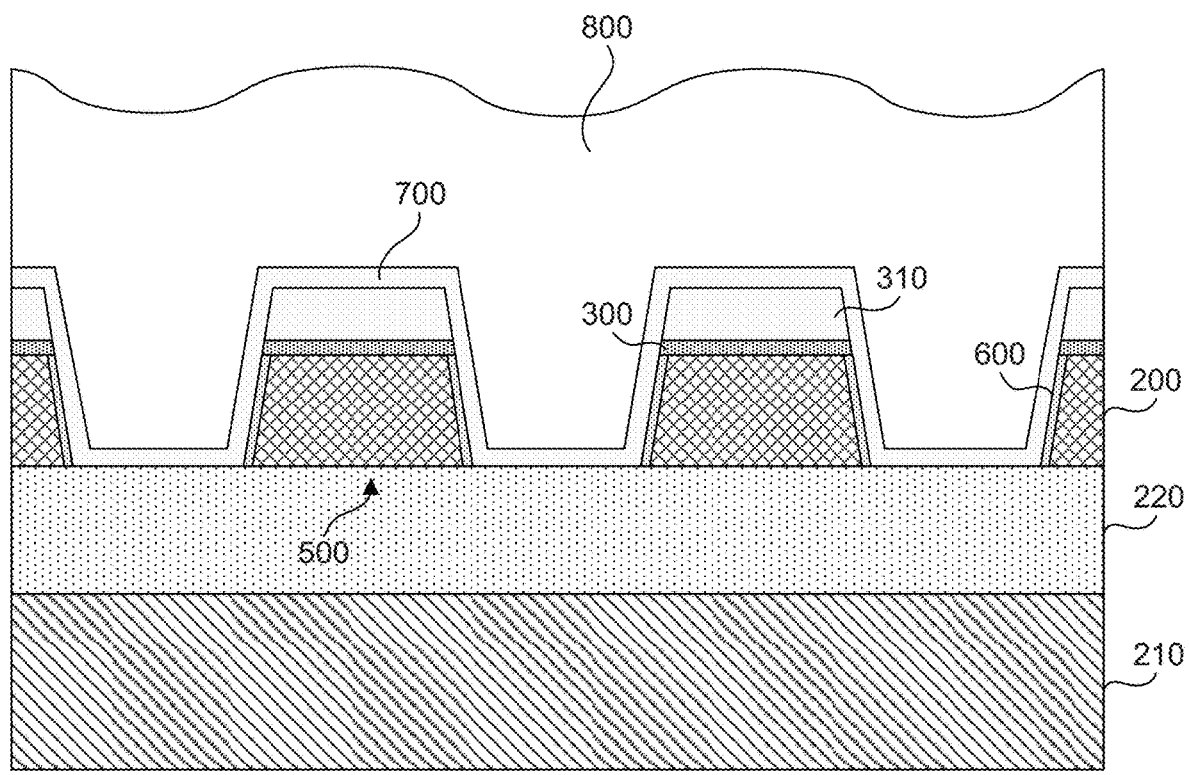
FIG. 8 is a cross-sectional view of semiconductor structures over a substrate after the deposition of a first dielectric, in accordance with some embodiments.
Figure 9:
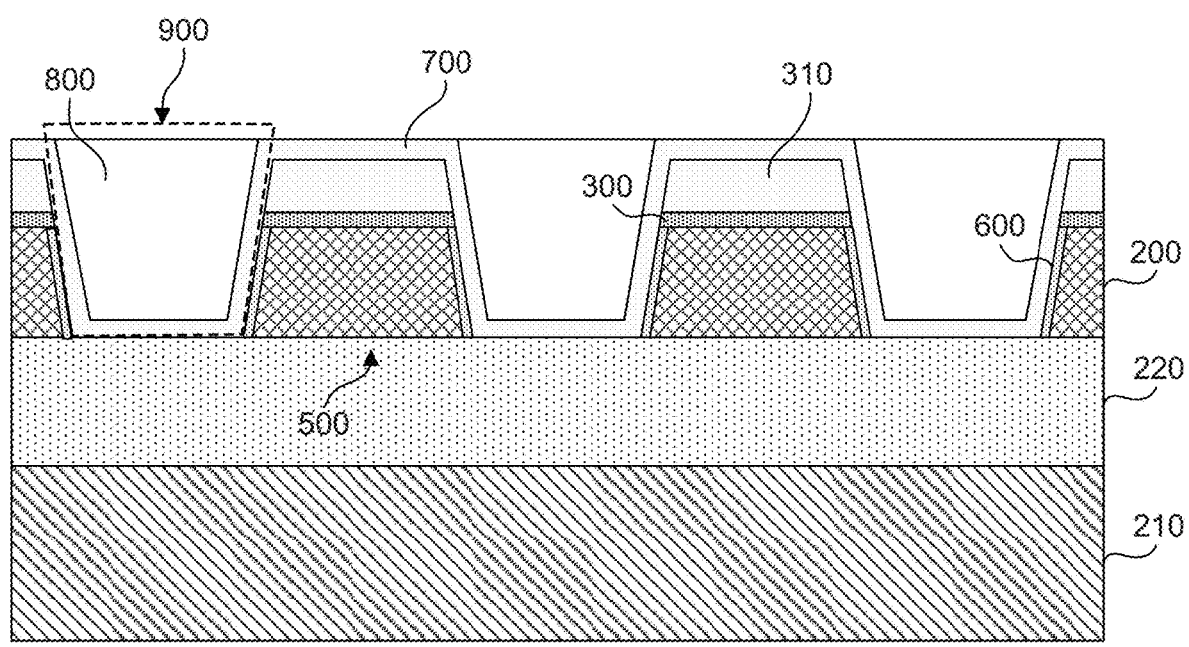
FIG. 9 is a cross-sectional view of isolation structures over a substrate after the etch process of a first dielectric, in accordance with some embodiments.

In referring to FIGS. 1 and 8, fabrication method 100 continues with operation 140, where a first dielectric 800 is deposited between semiconductor structures 500 to form isolation structures (e.g., STI structures). In some embodiments, first dielectric 800 is deposited with a high density plasma CVD (HDP-CVD) process that has good gap-fill properties. For example, first dielectric 800 can fill completely the space between semiconductor structures 500 (e.g., without the formation of voids or gaps). In FIG. 9, a chemical mechanical planarization (CMP) process can polish first dielectric 800 until it is coplanar with the top surface of second liner 700 (e.g., second liner 700 can act as a stop layer for the CMP process). As a result, isolation structures 900 are formed. In some embodiments, isolation structures 900 are STI structures that can electrically isolate semiconductor structures 500. By way of example and not limitation, isolation structures 900 can include first dielectric 800 and portions of second liner 700 that are disposed over the sidewalls of semiconductor structures 500 and the top surface of dielectric layer 220, as shown in FIG. 9 by the dashed closed line.

Figure 10:
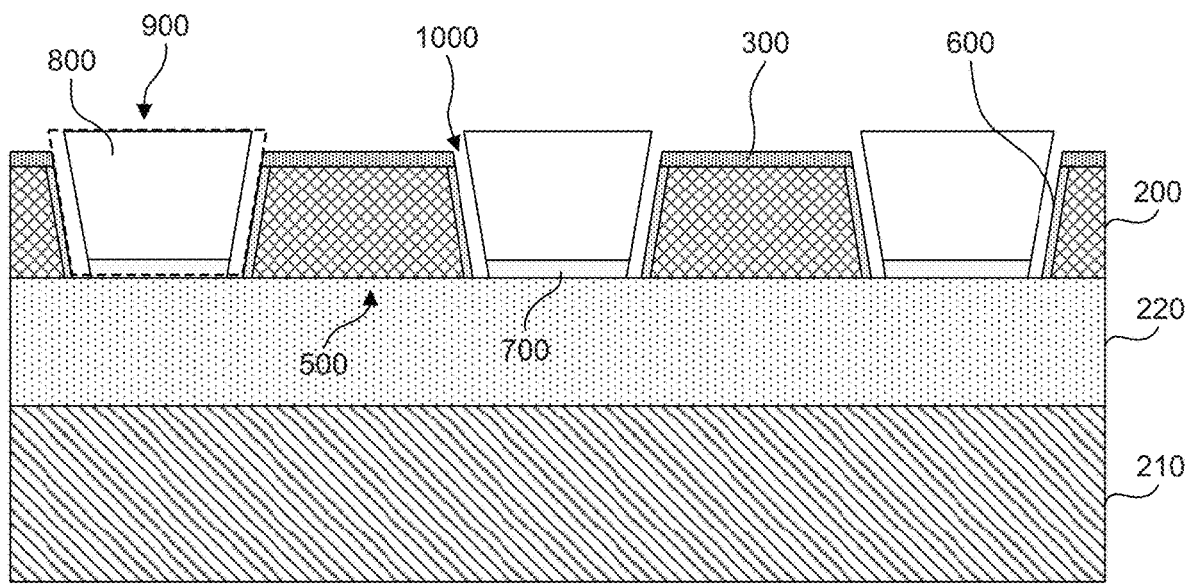
FIG. 10 is a cross-sectional view of isolation structures over a substrate after the removal of the second liner, in accordance with some embodiments.

Fabrication method 100 of FIG. 1 continues with operation 150. In operation 150, second liner 700 is removed between isolation structures 900 and first liner 600 to form respective openings 1000, as shown in FIG. 10. In some embodiments, removal of second liner 700 can be achieved with a wet etch process (also referred to as wet chemical strip). By way of example and not limitation, the wet etch process can include hot phosphoric acid ($H_3PO_4$) and it can be performed at a temperature of about 160° C. Further, the wet etch chemistry can be selected to have high selectivity towards second liner 700 as opposed to exposed oxide material—such as oxide layer 300 and first liner 600, which are both silicon-based oxides (e.g., silicon oxide). For example, the wet etch process may exhibit a selectivity ratio for second liner 700 and oxide layer 300, or second liner 700 and first liner 600, of about 100:1. If the selectivity ratio is not high enough, portions of oxide layer 300 and first liner 600 will also be etched during the etch process.

During the wet etch process, second liner 700 and nitride layer 310 are both removed (e.g., etched) over oxide layer 300. As discussed above, both second liner 700 and nitride layer 310 can include silicon nitride. Hence, the selectivity of the wet etch process towards second liner 700 and nitride layer 310 can be the same (e.g., selectivity ratio 1:1). According to some embodiments, the wet etch process can be timed so that a portion of second liner 700 between isolation structures 900 and dielectric layer 220 is not removed (e.g., etched). In some embodiments, second liner 700 under dielectric 800 can be equal or narrower than the base of dielectric 800. In some embodiments, second liner 700 underneath dielectric 800 can be wider that the base of dielectric 800 and cover the entire exposed surface of dielectric layer 220. Alternatively, second liner 700 underneath dielectric 800 can be wider that the base of isolation structures 900 but not cover the entire exposed surface of dielectric layer 220. In some embodiments, the thickness of second liner 700 over the sidewalls of semiconductor structures 500 can be used to control the width of openings 1000 and ultimately the size of the air-gaps in the STI structures.

Referring to FIG. 1 and FIG. 10, fabrication method 100 continues with operation 160 and the deposition of a second dielectric (e.g., capping dielectric layer) to form an air-gap (e.g., an air-pocket or cavity), between first dielectric 800 and first liner 600. For example, an air-gap can be formed when the second dielectric seals the top entrance of opening 1000. Further, openings 1000 can have an aspect ratio—e.g., a high aspect ratio between about 5:1 to about 20:1—that prevents second dielectric material from filling opening 1000. According to some embodiments, the combination of the high deposition rate of second dielectric 1120 and the high aspect ratio of openings 1000 form air-gaps at the locations of openings 1000. In some embodiments, the second dielectric can be deposited by a PECVD process, a physical vapor deposition (PVD), or any other suitable oxide deposition process with appropriate deposition rate.

Figure 11:
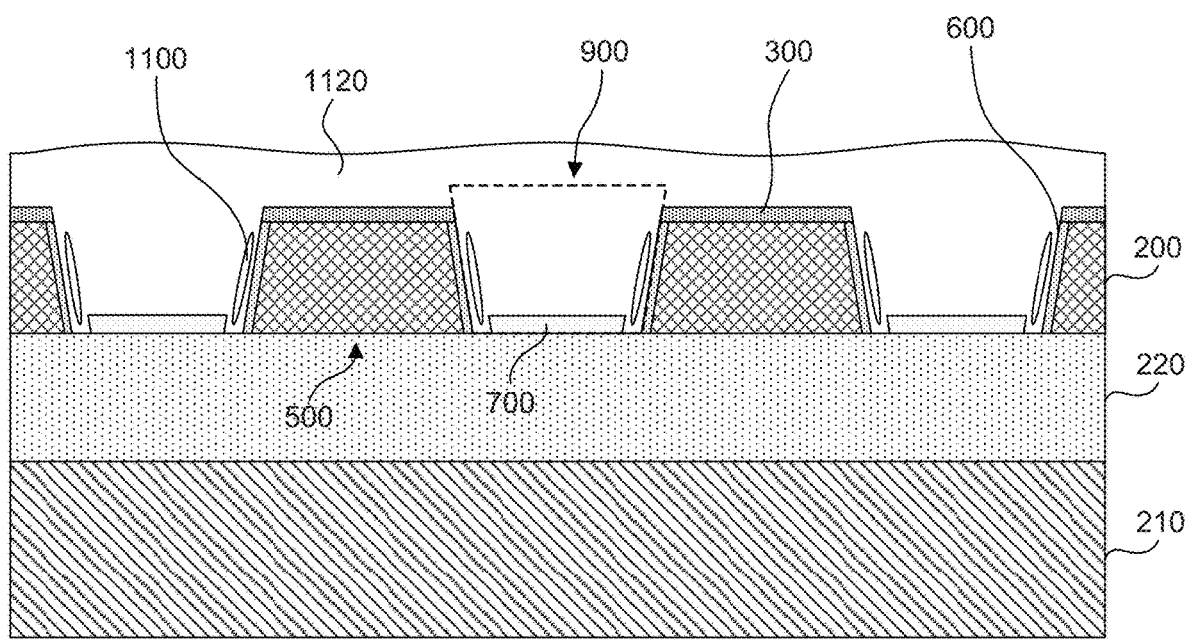
FIG. 11 is a cross-sectional view of isolation structures over a substrate after the deposition of a second dielectric to form air-gaps, in accordance with some embodiments.

FIG. 11 shows the resulting air-gaps (e.g., air-pockets or cavities) 1100 after the deposition of second dielectric 1120. In some embodiments, the first and the second dielectrics (e.g., 800 and 1120, respectively) are the same material, e.g., silicon oxide ($SiO_2$). Further, until opening 1000 is sealed, second dielectric 1120 may or may not reach the bottom of opening 1000. Therefore, in some embodiments, the resulting air-gaps may or may not extend to the top surface of dielectric layer 220. Additionally, the size of air-gaps (or air-pockets, or cavities) 1100 can be smaller than the size of openings 1000 in operation 150. This is because second dielectric 1120 may continue to be deposited into opening 1000 until the top entrance of the opening is capped (e.g., sealed). By way of example and not limitation, the size of air-gaps 1100 may depend, among other things, on (i) the size of openings 1000 (which can be modulated by the thickness of second liner 700 and the height of semiconductor structures 500), (ii) the sidewall slope of semiconductor structures 500, and (iii) the deposition process parameters of second dielectric 1120. For example, the deposition process parameters of second dielectric 1120 can modulate the gap-fill properties and the deposition rate of second dielectric 1120 in openings 1000. In some embodiments, the width of air-gaps 1100 can range from about 10 nm to about 25 nm (e.g., from 10 nm to 25 nm).

In some embodiments, air-gaps (e.g., air-pockets, or cavities) 1100 can be filled with one or more gases that are present during the deposition process of second dielectric 1120. In other words, air-gaps 1100 may not be filled with atmospheric air. In some embodiments, air-gaps (e.g., air-pockets, or cavities) 1100 can be filled with an inert gas or gases such as nitrogen, helium, and argon.

In some embodiments, a porogen containing material (e.g., carbon-doped silicon dioxide that contains loosely bounded methyl groups) can be used to fill openings 1000 of FIG. 10. The porogen containing material can be cured and converted to a porous low-k material with a k value below 3.6 (e.g., k value of about 3). During the curing process, the porogen is released leaving behind pores in the material. By way of example and not limitation, the curing process may include exposure to UV radiation that has a wavelength between about 150 nm and about 400 nm. Other curing process may be used, including a thermal process. In some embodiments, openings 1000 can be filled directly with a low-k dielectric material, such as carbon-doped silicon dioxide or any other suitable low-k dielectric material with appropriate gap-fill properties.

In some embodiments, a dry etch process, wet etch process, or a combination of a dry and a wet process can be used to remove (e.g., etch) second dielectric 1120 over semiconductor structures 500, until oxide layer 300 is exposed. By way of example and not limitation, a dry etch process can include a fluorocarbon based chemistry (e.g., fluorinated hydrocarbons), such as tetrafluoromethane ($CF_4$), trifluromethance ($CHF_3$), and the like. On the other hand, a wet etch process can include a diluted solution of hydrofluoric acid (HF) with a buffer, such as ammonium fluoride ($NH_4F$), diluted HF ($HF/H_2O$), $H_3PO_4$, sulfuric acid with deionized water ($H_2SO_4/H_2O$), or any combinations thereof. The dry or wet etch process can be for example timed so that first dielectric 800 is not removed during the etch process. For example, the dry or wet etch process can be timed so that it is terminated when oxide layer 300 is exposed. The aforementioned etch chemistries are exemplary and, therefore, not limiting. Other suitable dry etch or wet etch chemistries may be used.

Figure 12:
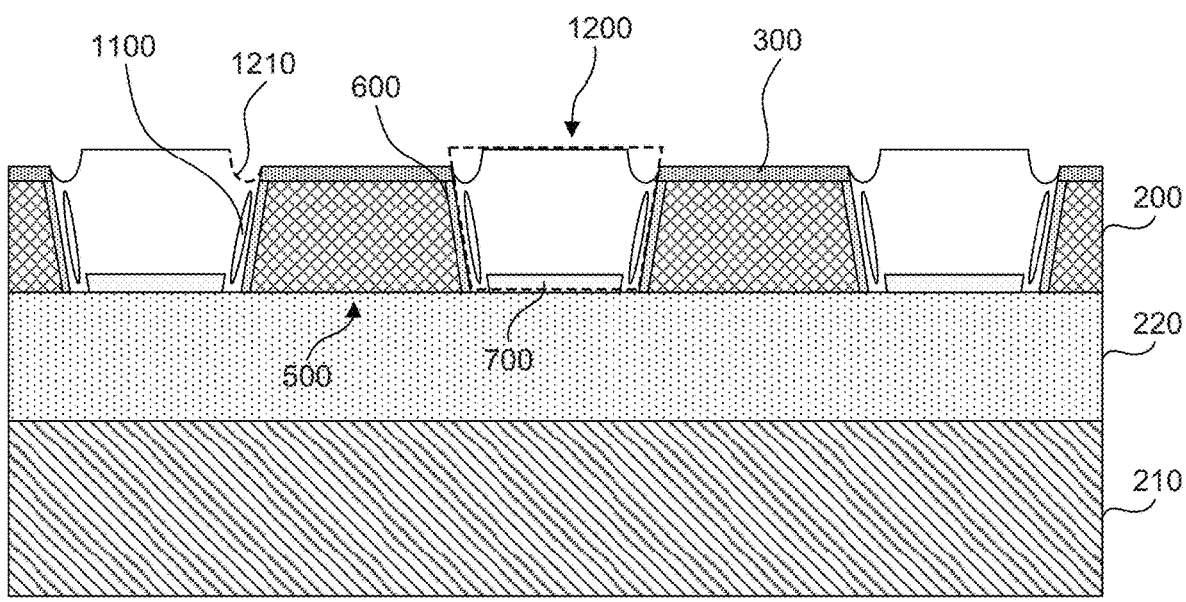
FIG. 12 is a cross-sectional view of isolation structures over a substrate with air-gaps therein, in accordance with some embodiments.

As a result of the aforementioned dry or wet etch process, isolation structures 1200 (e.g., STI structure 1200) with air-gaps along their sidewalls are formed, as shown in FIG. 12. As a result of the etching process, a divot 1210 can be formed on each corner of isolation structure 1200. In some embodiments, divots (e.g., like divot 1210) can have a depth between about 2 nm and 10 nm. If divots 1210 are not formed, the top surface of isolation structure 1200 can be substantially flat or lightly convex with round corners.

In some embodiments, fabrication method 100 introduces air-gaps in isolation structures (e.g., STI structures) by retaining the original size of the isolation structures and the pitch of the semiconductor structures. In other words, no modification to the pitch of the semiconductor structures is required and, subsequently, to the reticles (e.g., photomask) used in the photolithography operations. This means that fabrication method 100 can be introduced to an existing STI formation process flow without any changes to the photolithography process.

Figure 13:
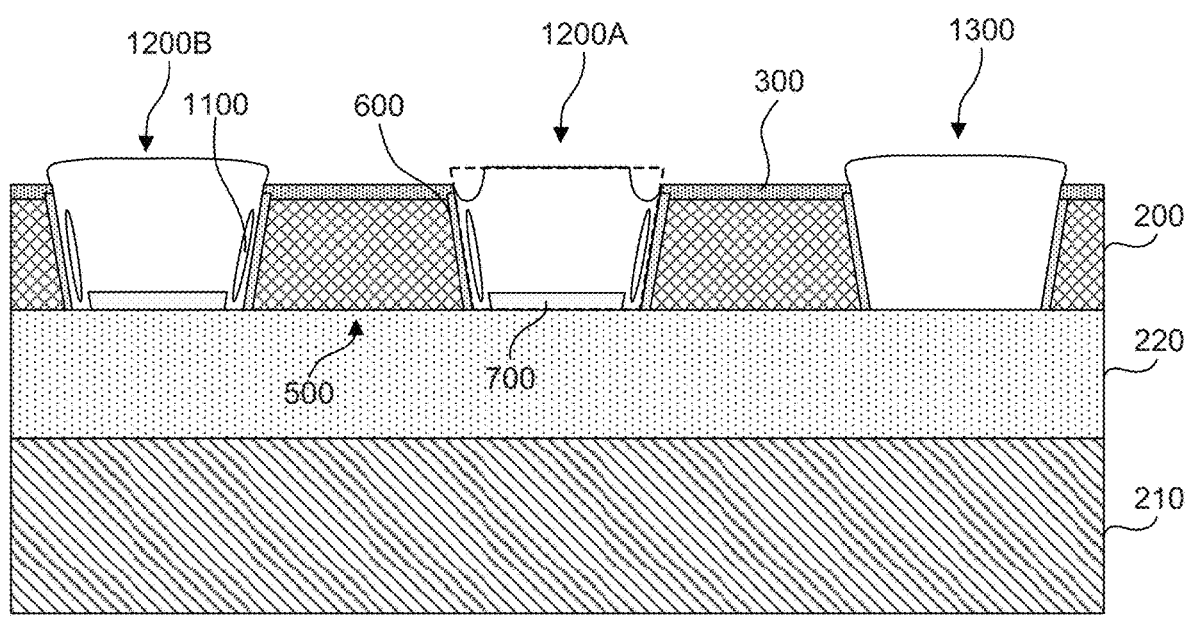
FIG. 13 is a cross-sectional view of different types of isolation structures over a substrate, in accordance with some embodiments.

According to some embodiments, it is possible that isolation structures without air-gaps are formed alongside with isolation structures with air-gaps (e.g., like isolation structures 1200 of FIG. 12) on the same substrate (e.g. wafer). This means that the resulting chip or integrated circuit can include STI structures with and without air-gaps if desired. In other words, fabrication method 100 can be applied on selected isolation structures of substrate 210. Additionally, it is also possible that isolation structures with air-gaps and divots are formed alongside with divot-free isolation structures that have air-gaps. For example, FIG. 13 shows the three types of isolation structures that can be formed on a single substrate. In the example of FIG. 13, isolation structure 1200 A has both air-gaps and divots; isolation structure 1200 B has air-gaps but no divots (e.g., a lightly convex top surface with rounded corners); and isolation structure 1300 can have divots, or be divot-free, without air-gaps. According to some embodiments, isolation structure 1200 A and isolation structure 1200 B are formed using the fabrication method 100 of FIG. 1. As a result of fabrication method 100, the air-gaps are formed embedded in the isolation structures, along each sidewall of isolation structures 1200 A and 1200

B, e.g., along the sidewalls of semiconductor structures 500 and over first liner 600. By way of example and not limitation, application of fabrication method 100 on selective areas of substrate 210 can be achieved with photolithography methods. For example, the isolation structures that will be "air-gap" free, will be masked by a photoresist layer (or a hard mask) during operation 130 of fabrication method 100 (e.g., during the deposition of second liner 700 over semiconductor structures 500 and first liner 600).

Figure 14:
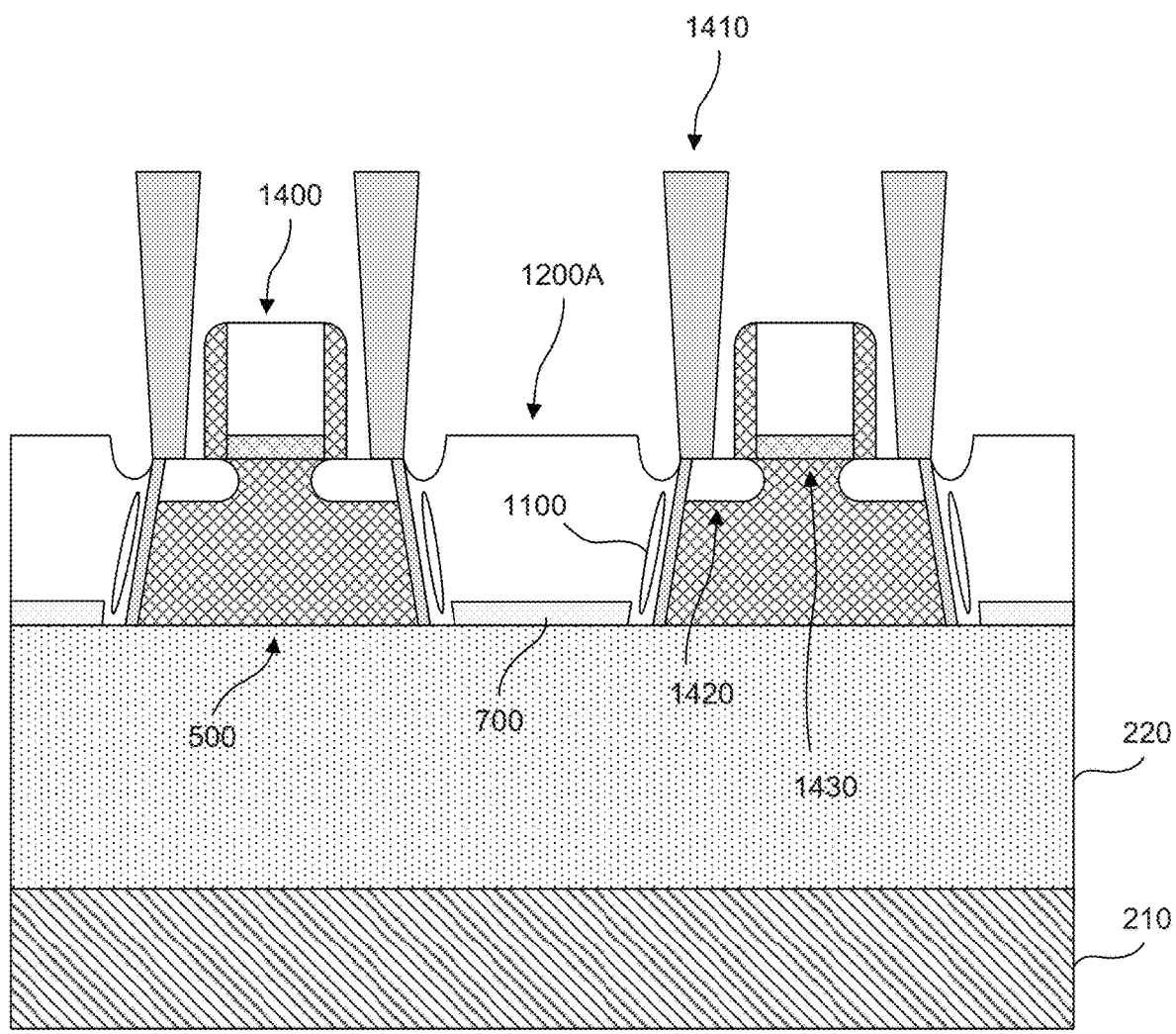
FIG. 14 is a cross-sectional view of isolation structures with air-gaps between semiconductor structures with devices thereon, in accordance with some embodiments.

FIG. 14 is a cross-sectional view of isolation structures (e.g., STI structures) 1200A between semiconductor structures 500, where devices 1400, metal contacts 1410, and source/drain (S/D) regions 1420 have been formed on semiconductor structure 500. In some embodiments, devices 1400 are FETs. These FETs can be either NFETs or PFETs, and can be part of an integrated circuit (IC) formed on an SOI substrate (or a bulk, high-resistive semiconductor substrate). The channel region 1430 of FETs 1400 is located in semiconductor structure 500 between the S/D regions 1420 and below FET 1400. According to some embodiments, isolation structures 1200A with air-gaps, fabricated with method 100 of FIG. 1, can provide enhanced electrical isolation and protection from parasitic capacitances (e.g., in the GHz range) of parasitic capacitors that can be formed between neighboring devices 1400. Further, due to the presence of air-gaps, isolation structures 1200A can mitigate the compressive stress that is induced to channel region 1430 below FETs 1400, even if the edge of isolation structure 1200A is close to channel region 1430 (e.g., within 0.5 μm).

Fabrication method 100 may not be limited to RF SOI technology or RF SOI applications. For example, fabrication method 100 can be implemented in other complementary metal oxide semiconductor (CMOS) applications where protection against parasitic capacitances is required. Alternatively, method 100 can be applied to any other semiconductor or non-semiconductor processing that includes shallow trench isolation (STI) structures, or formation thereof.

The embodiments described herein are directed to a fabrication method that can form air-gaps (air-pockets or cavities) in STI structures. In some embodiments, the fabrication method includes a sacrificial nitride layer that can be introduced prior to the deposition of the STI material between the semiconductor structures. The sacrificial nitride layer can be subsequently removed after the deposition of the STI material so that an opening can be formed along the sidewall surfaces of adjacent semiconductor structures. A second deposition of a dielectric material can seal the entrance of the opening and form an air-gap, which is embedded in the STI structure along the sidewalls of the semiconductor structure. The thickness of the sacrificial nitride layer, in combination with the process conditions during the second deposition of the dielectric material, can control in part the size of the embedded air-gaps (air-pockets or cavities) in the resulting STI structure. Further, and on the same substrate, STI structures with and without air-gaps can be formed. In other words, the fabrication method described herein can be applied to selective STI structures on the substrate. Such selectivity can be achieved with photolithography methods. For example, the STI structures that will not form air-gaps can be masked by a photoresist layer, or a hard mask, during the deposition of the sacrificial nitride layer.

In some embodiments, a structure includes semiconductor islands, which are formed over a substrate, with liners disposed on the sidewalls of the semiconductor islands and an isolation structure disposed between the semiconductor islands. Further, the isolation structure includes one or more air-gaps that are formed along the liners.

In some embodiments, an integrated circuit includes an insulating layer, a semiconductor layer disposed on the insulating layer and a field effect transistor formed on one or more of the semiconductor islands. The semiconductor layer further includes: semiconductor islands, a liner disposed on each sidewall of the semiconductor islands and an isolation structure between the semiconductor islands. The isolation structure includes an oxide layer with an air-pocket disposed along the liner of each sidewall of the semiconductor islands and a nitride layer disposed between the insulating layer and the oxide layer.

In some embodiments, a method includes patterning a semiconductor layer over a substrate to form semiconductor islands and oxidizing the sidewall surfaces of the semiconductor islands to form first liners on the sidewall surfaces. Further the method includes depositing a second liner over the first liners and the substrate and depositing a first dielectric layer between the semiconductor islands. The second liner between the first dielectric layer and the first liners is removed to form openings between the first dielectric layer and the first liners and a second dielectric layer is deposited over the first dielectric layer to enclose the openings and form air-gaps between the first dielectric layer and the first liners so that the gaps are positioned along the first liners.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
   semiconductor structures formed on a substrate;
   an isolation structure between adjacent semiconductor structures comprising a first solid dielectric material enclosed by a second solid dielectric material, wherein the first solid dielectric material is positioned along each sidewall of the semiconductor structures; and
   a liner layer positioned at a bottom portion of the isolation structure and in contact with the substrate, wherein a gap between the liner layer and a sidewall of one of the semiconductor structures comprises the second solid dielectric material.

2. The structure of claim 1, further comprising an oxide layer interposed between the isolation structure and the sidewalls of the semiconductor structures.

3. The structure of claim 1, wherein the semiconductor structures comprise a transistor structure formed on the substrate.

4. The structure of claim 1, wherein the isolation structure further comprises indentations on its top surface, wherein each indentation is vertically aligned to the first solid dielectric material.

5. The structure of claim 1, wherein the isolation structure comprises a shallow trench isolation region surrounding the sidewalls of the semiconductor structures.

6. The structure of claim 1, wherein the first solid dielectric material has a lower dielectric constant than the second solid dielectric material.

7. The structure of claim 1, wherein the first solid dielectric material forms a dielectric structure with an aspect ratio between about 5:1 and about 20:1.

8. A method, comprising:
  patterning a semiconductor layer on a substrate to form spaced apart semiconductor islands;
  growing an oxide layer on sidewalls of the semiconductor islands;
  depositing a sacrificial layer on the oxide layer and on exposed portions of the semiconductor layer;
  depositing a dielectric layer on the sacrificial layer to surround the spaced apart semiconductor islands;
  selectively removing the sacrificial layer with a wet etching process to form a gap between the dielectric layer and the oxide layer alongside the sidewalls of the semiconductor islands, wherein a width of the gap is based on a thickness of the sacrificial layer;
  filling the gap with a porogen containing material; and
  treating the porogen containing material to form a porous material.

9. The method of claim 8, wherein filling the gap with the porogen containing material comprises depositing carbon-doped silicon dioxide comprising methyl groups.

10. The method of claim 8, wherein treating the porogen containing material comprises exposing the porogen containing material to an ultraviolet radiation or a thermal treatment.

11. The method of claim 8, wherein the porous material comprises a low-k dielectric.

12. The method of claim 8, wherein the porous material has a lower dielectric constant than the dielectric layer.

13. The method of claim 8, wherein the width of the gap is between about 10 nm and about 50 nm.

14. The method of claim 8, further comprising forming, between the semiconductor islands, isolation structures free from the porogen containing material.

15. A method, comprising:
  patterning a semiconductor layer on a substrate to form spaced apart semiconductor islands;
  growing an oxide layer on sidewalls of the semiconductor islands;
  depositing a sacrificial layer on the oxide layer and exposed portions of the semiconductor layer;
  depositing a first dielectric layer on the sacrificial layer to surround the spaced apart semiconductor islands;
  selectively removing the sacrificial layer with a wet etching process to form a gap between the first dielectric layer and the oxide layer, wherein the gap is positioned alongside each sidewall of the semiconductor islands; and
  filling the gap with a second dielectric layer, wherein the second dielectric layer has a lower dielectric constant than the first dielectric layer.

16. The method of claim 15, wherein the wet etching process comprises a selectivity ratio between the sacrificial layer and the first dielectric layer or the oxide layer of about 100:1.

17. The method of claim 15, wherein depositing the sacrificial layer comprises depositing a nitride at a thickness between about 10 nm and about 50 nm.

18. The method of claim 15, wherein selectively removing the sacrificial layer comprises forming the gap with an aspect ratio between about 5:1 and about 20:1.

19. The method of claim 15, wherein the second dielectric layer comprises a porous material.

20. The structure of claim 1, wherein the first solid dielectric material comprises a porous material.

\* \* \* \* \*